United States Patent [19]

Frister

[11] Patent Number: 4,571,612
[45] Date of Patent: Feb. 18, 1986

[54] CORROSION-PROTECTED ELECTRICAL CIRCUIT COMPONENT

[75] Inventor: Manfred Frister, Schwieberdingen, Fed. Rep. of Germany

[73] Assignee: Robert Bosch GmbH, Stuttgart, Fed. Rep. of Germany

[21] Appl. No.: 504,840

[22] Filed: Jun. 16, 1983

Related U.S. Application Data

[63] Continuation-in-part of Ser. No. 382,930, May 28, 1982.

[30] Foreign Application Priority Data

Jul. 30, 1982 [DE] Fed. Rep. of Germany ....... 3228457

[51] Int. Cl.[4] ...................... H01L 23/02; H01L 23/28
[52] U.S. Cl. ........................................ 357/81; 357/72; 357/74; 357/77; 357/78; 174/52 PE
[58] Field of Search ...................... 357/72, 74, 77, 81, 357/78; 174/52 PE

[56] References Cited

U.S. PATENT DOCUMENTS

| 3,271,638 | 9/1966 | Murad | 357/81 |
| 3,876,926 | 4/1975 | Schott et al. | 174/52 PE |
| 4,115,838 | 9/1978 | Yagusic et al. | 357/81 |

Primary Examiner—Martin H. Edlow
Assistant Examiner—Jerome Jackson
Attorney, Agent, or Firm—Frishauf, Holtz, Goodman & Woodward

[57] ABSTRACT

To protect a weld connection between an external conductor (11, 12) and a projecting pin (5, 6) of an electronic component, the base plate (2) of the electronic component has a tubular element (8) attached thereto, for example formed with an insertion slit (9) through which the externally accessible conductor (11, 12) extends, weld connections (511, 612) being formed between the external conductor and the pin. The weld connection is protected by a casting compound of corrosion-protective, insulating material, introduced into the cup-shaped space between the bottom plate (2) and the tubular element (8), the casting compound entirely surrounding the weld connections.

20 Claims, 3 Drawing Figures

CORROSION-PROTECTED ELECTRICAL CIRCUIT COMPONENT

This application is a continuation-in-part of my earlier application Ser. No. 382,930, filed May 28, 1982, before Examiner Jackson, AU 253.

The present invention relates to an electrical circuit component, and more particularly to an electrical circuit component - network connection arrangement in which the circuit component is constructed to provide corrosion-protected connections with circuit or network conductors, and especially for semiconductor structures adapted to be connected to circuit structures, buses or conductors in automotive equipment.

BACKGROUND

It is frequently necessary to connect electronic components, such as semiconductors, semiconductor assemblies, circuit combinations, chips and the like to conductor bus bars. Frequently, connections of this type, especially when involving transfer of substantial currents, are made by welding connecting pins on the electronic components to bus bars or conductors provided in an existing holding structure, for example part of a connection arrangement or bus arrangement within an alternator adapted to be coupled to an automotive engine. The connection of electronic components may be with freestanding conductors or conductors applied to a printed circuit (PC) board, by welding, soldering, or the like. It is also known to provide contacting arrangements by means of separable plug-pin or plug-socket connections.

Electronic components, and particularly structures adapted to be associated with alternators which have openings to provide for cooling air are subject varying environment influences, and particularly to humidity which may include salt air. The connections may corrode, thus detracting both from the mechanical as well as electrical stability. Remnants of fluxes, reacting with humidity, particularly with salt-laden air, affect the connections previously made.

THE INVENTION

It is an object to so construct an electrical component, for example a structure including a housing for semiconductor components, that contact terminals projecting from the housing can readily be protected against corrosion.

Briefly, a projecting tubular element is secured to the bottom wall of the housing, projecting in the direction of at least one of the terminal pins extending from the housing, the projecting distance being approximately at least as great as the projecting distances of the terminal pin or the location of the connection thereto. A connecting conductor can be welded, soldered, or otherwise bonded to the projecting pin, and the space within the projecting tubular element and the bottom wall is then filled with a corrosion-protective plastic insulating compound, which entirely surrounds the bonding points or bonding locations between the connecting pin or pins from the semiconductor element as well as the adjacent region of the connecting conductor.

The electronic element, and the connection arrangement used therewith, has the advantage that the element itself can be connected as desired and in whatever location is suitable, thus avoiding the necessity of specially constructed or positioned plug-socket connections or the like while, at the same time, protecting the bonding connections, typically welds, against environmental influences.

DRAWINGS

Figure 1:
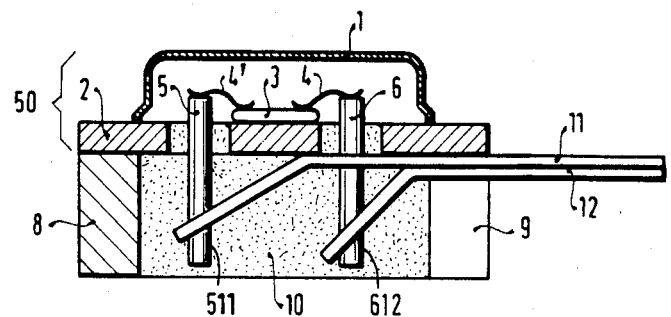
FIG. 1 is a schematic sectional view through an electronic element which is connected by welds to external conductors.

An electronic element 50 has a metallic cap 1 secured to a bottom plate 2, for example by being welded thereto. The interior of the housing formed by the metallic cap 1 and the bottom plate 2 retains a semiconductor body, for example a chip 3 on the socket plate 2, by soldering or adhesion. Connecting pins 5, 6 extend through the bottom plate 2 by melt glass seals, so that the pins 5, 6 are insulated from the bottom plate 2, while being carried therethrough and effecting a seal between the inside and the outside of the housing 1. Bonding wires 4, 4' extend from the semiconductor 3 to the connecting pins 6, 5. External equipment is connected to the electronic component 3 by external conductors 11, 12. The conductors 11, 12 are welded to the pins 5, 6 to form weld connections 511, 612.

In accordance with the invention, and to protect the weld connections 511, 612, a tubular extension 8 is secured to the bottom plate 2, for example by welding, the tubular projecting element 8 extending preferably slightly beyond the extending distance of the pins 5, 6 but at least slightly beyond the weld connections 511, 612. An insulating, corrosion-protective plastic casting compound 10 is then introduced into the space defined by the bottom wall 2 of the electronic component and the tubular extension 8, the casting compound entirely surrounding the weld connections 511, 612.

Figure 2:
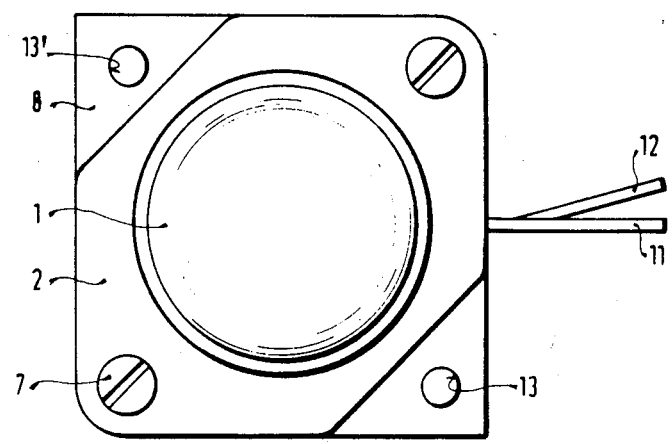
FIG. 2 is a top view.

Housing 8 need not be connected to the socket plate 2 by welding; it can be attached thereto by screws. FIG. 2 illustrates a housing structure 8 which is of essentially square top view, formed with tapped holes into which screws 7 extend, to securely attach the bottom plate 2 to the projecting extension 8, and provide a good heat-conductive connection between the bottom plate 2, which frequently also acts a heat sink and the projection 8. The projection 8 is additionally formed with corner holes 13, 13' to permit attachment of the assembly to a bottom support structure, for example a printed circuit (PC) board. Alternatively, the screws 7 can be elongated and secure the assembly directly on a substrate or support, for example by rotating the tubular structure 8 by 90° and extending screws 7 through the untapped blank holes 13, 13'.

The tubular structure 8 preferably is formed with a slit 9 to permit ready insertion and precise placement of the conductors 11, 12 for welding. To prevent leakage of casting compound before the compound 10 has set, the slot can be temporarily sealed with an insert strip or a plastic sleeve placed around the tubular extension 8 with only a small notch to permit passage of the conductors 11, 12 after they have been welded at points 511, 612.

In accordance with a feature of the invention, the structure 8 can be of a tubular section of selected cross-sectional shape, for example square, rectangular, or circular, depending on The location of the pins 5, 6 projecting from the electronic structure, the shape of the base plate 2 thereof, position of attachment holes thereon, and the like. In one form, for example as illustrated in FIG. 1, the element 8 is cylindrical, except for the radial slot 9, to permit passage of the conductors 11, 12. The tubular structure 8 can be made as a cut portion from an extruded tube.

A suitable casting compound which is corrosion-protective, and insulating, is polyurethane.

In another form of the invention, the bottom or socket plate 2 and the extension 8 can be made as an integral element, the bottom plate 2 and the extension 8 being formed as a single deep-drawn cup-shaped element which, as an integral unit, provides the bottom plate 2 for the semiconductor cap 1 and the projecting wall portions 8 to retain a casting compound, the wall portions 8 extending at least as far as the length of the pins 5,6.

Filling the compound 10 into the space within the tubular structure 8 can also be done from the side. If so, a bottom plate, which can be permanently connected to the tubular structure 8, for example by welding, soldering, or adhesion can be used, or a temporary holding plate clampped against tubular structure 8, to prevent the material of the insulating corrosion-protective fill 10 from running out.

Figure 3:
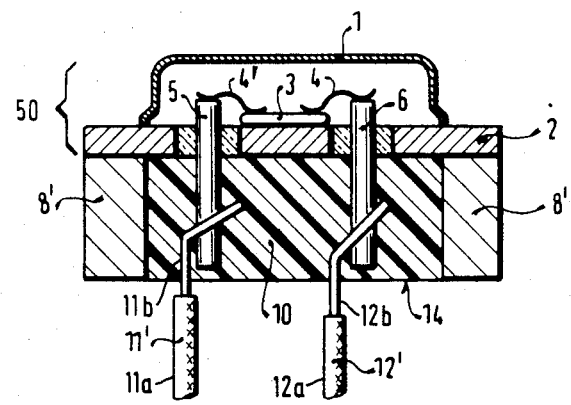
FIG. 3 is a section similar to FIG. 1 showing another embodiment.

FIG. 3 illustrates another embodiment, in which the cylindrical element 8' has a continuous circular wall, and the bottom opening 14 is left free. The wire cores 11b, 12b of the conductors 11', 12' are welded to the connecting posts 5, 6, as before; the conductors are then angled-off as shown in FIG. 3. The insulating jackets 11a, 12a may start beneath the opening 14, as shown at conductor 12', or may extend up to or even into the insulating compound 10 which, then, can be poured directly into the opening formed by the tubular structure 8', which will be in form of a cylindrical sleeve. For various application, this way of protecting the weld connection between the conductors 11b, 12b and the pins of posts 5, 6 is the easiest to manufacture.

Various changes and modifications may be made within the scope of the inventive concept.

I claim:
1. Corrosion-protected circuit component (50) and connection arrangement for forming a bond connection (511, 612) with a connection conductor (11, 12), said component (50) having
   a housing (1, 2) including
   a cup-shaped metal cap (1);
   a metal base plate (2), said metal base plate and said cup-shaped metal cap being welded together, the base plate (2) forming a bottom plate of the semiconductor component;
   a semiconductor body (3) secured to the bottom plate (2) of the housing interiorly thereof;
   at least one terminal connection pin (5, 6) extending and sealed through the bottom plate of the housing, having an interior portion located within the housing and an exterior portion exteriorly projecting from the housing, the at least one pin being insulated from the housing and positioned inwardly of the marginal portions of the bottom plate, the exterior portion projecting from the bottom plate of the housing by a predetermined distance;
   at least one bonding wire (4, 4') located interiorly of the housing and extending between at least one selected region of the semiconductor body (3) and the portion of the at least one connection pin within the housing;
   and a protective tubular element (8) extending from the bottom wall of the housing in the direction of the exteriorly projecting portion of the at least one terminal connection pin for a distance which is at least as great as the projection distance of the at least one terminal connection pin to permit formation of a bond connection (511, 612) inwardly of the end of the at least one connection terminal pin and thereby bonding of the connection conductor (11, 12) to the at least one terminal connection pin in a position protected by the tubular element;
   said tubular element (8) and the bottom plate (2) forming an open cup-shaped structure to permit introduction of an insulated corrosion-protective plastic compound (10) thereinto to embed and protect the bond connection (511, 612) of the connecting conductor (11, 12) and the at least one terminal connection pin (5, 6); and wherein the connection conductor (11, 12) is an integral conductor leading outside of the housing (1, 2); the bond connection (511, 612) directly connecting the connection pin (5, 6) to the connection conductor.

2. Circuit component according to claim 1, wherein the tubular element (8, 8') is metallic.

3. Circuit component according to claim 1, wherein the bottom wall of the housing is metallic and forms a heat sink;
   and wherein said tubular element (8, 8') is a metallic extending portion secured to the bottom plate in good heat transferring relationship.

4. Circuit component according to claim 1, wherein the tubular element (8, 8') is formed with a radial slit (9), said connecting conductor (11, 12) being introduced into the cup-shaped structure through said slit.

5. Circuit component according to claim 1, wherein said tubular element (8') has a continuous circumference and is formed with an opening (14) at the side opposite the bottom plate (2), and said connecting conductor (11', 12') extends through said opening.

6. Circuit component according to claim 1, wherein said connecting conductor (11', 12') has a metallic core (11b, 12b) and an insulating covering (11a, 12a), the metallic core being exposed and free from said covering at least in part in the portion of the conductor located within said tubular element, and the insulating covering is applied over the metallic core at least adjacent and up to the insulating corrosion-protective plastic compound (10).

7. Circuit component according to claim 1, wherein the tubular element (8) is bonded to the bottom plate (2) to provide a tight, good heat-transferring connection thereto.

8. Circuit component according to claim 1, wherein the bottom plate (2) and said tubular element (8) form a single unitary cup-shaped structure.

9. The combination of an electrical circuit component (50) having a housing (1, 2) including
   a cup-shaped metal cap (1);
   a metal base plate (2), said metal base plate and said cup-shaped metal cap being welded together, the base plate (2) forming a bottom plate of the electrical circuit component;
   a semiconductor body (3) secured to the bottom plate (2) of the housing interiorly thereof;
   at least one terminal connection pin (5, 6) extending and sealed through the bottom plate of the housing, having an interior portion located within the housing and an exterior portion exteriorly projecting from the housing, the at least one pin being insulated from the housing and positioned inwardly of the marginal portions of the bottom plate, the exterior portion projecting from the bottom plate of the housing by a predetermined distance;

at least one bonding wire (4, 4') located interiorly of the housing and extending between at least one selected region of the semiconductor body (3) and the portion of the at least one connection pin within the housing with a bond connection (511, 612) with at least one connection conductor (11, 12), comprising an arrangement to protect the sealed-through passage of the at least one terminal connection pin and the bond connection (511, 612) of the at least one terminal connection pin with the at least one connection conductor (11, 12) including a protective tubular element (8) extending from the bottom plate of the housing in the direction of the exteriorly protecting portion of the at least one terminal connection pin for a distance which is at least as great as the projection distance of the at least one terminal connection pin, and forming an open cup-shaped structure, the bond connection (511, 612) being spaced from the bottom plate of the housing by a distance which is less than said projection distance and inwardly of the end of the at least one connection terminal pin whereby said bond connection will be placed in a position protected by the tubular element;

and an insulating, corrosion-protective plastic compound (10) filling said cup-shaped structure and entirely surrounding, encapsulating and embedding the bond connection between the at least one connection conductor (11, 12) and the at least one terminal connection pin (5, 6) and the exterior portion of the at least one connection conductor; and wherein the connection conductor (11, 12) is an integral conductor leading outside of the housing (1, 2); the bond connection (511, 612) directly connecting the connection pin (5, 6) to the connection conductor and being protected by said plastic compound.

10. Combination according to claim 9, wherein the tubular element (8, 8') is metallic.

11. Combination according to claim 9, wherein the bottom plate of the housing is metallic and forms a heat sink; and wherein said tubular element (8, 8') is a metallic extending portion secured to the bottom plate in good heat transferring relationship.

12. Combination according to claim 9, wherein the tubular element (8, 8') is formed with a radial slit (9), said connecting conductor (11, 12) being introduced into the cup-shaped structure through said slit.

13. Combination according to claim 9, wherein said tubular element (8') has a continuous circumference and is formed with an opening (14) at the side opposite the bottom plate (2), and said connecting conductor (11', 12') extends through said opening.

14. Combination according to claim 9, wherein said connecting conductor (11', 12') has a metallic core (11b, 12b) and an insulating covering (11a, 12a), the metallic core being exposed and free from said covering at least in part in the portion of the conductor located witin said tubular element, and the insulating covering is applied over the metallic core at least adjacent and up to the insulating corrosionprotective plastic compound (10).

15. Combination according to claim 9, wherein the tubular element (8) is bonded to the bottom plate (2) to provide a tight, good heat-transferring connection thereto.

16. Combination according to claim 9, wherein the bottom plate (2) and said tubular element (8) form a single unitary cup-shaped structure.

17. Combination according to claim 1, wherein said bond connection comprises a weld connection.

18. Combination according to claim 1, wherein said insulating corrosion-protective plastic compound comprises polyurethane.

19. Combination according to claim 1, wherein said at least one connecting conductor (11, 11'; 12, 12') has a metallic core (11b, 12b) and an insulating covering (11a, 12a), the metallic core being exposed and free from said covering at least in part in the portion of the conductor located within said tubular element and adjacent to said bond connection, and the insulation covering is applied over the metallic core and extends within said protective tubular element (8), the insulating, corrosion-protective plastic compound (10) encapsulating and embedding the entirety of the bond connection and the portion of the insulating covering over the metallic core located within the open cup-shaped structure.

20. Combination according to claim 19, wherein said bond connection comprises a weld connection.

* * * * *

UNITED STATES PATENT AND TRADEMARK OFFICE
CERTIFICATE OF CORRECTION

PATENT NO. : 4,571,612

DATED : February 18, 1986

INVENTOR(S) : Manfred FRISTER

It is certified that error appears in the above-identified patent and that said Letters Patent is hereby corrected as shown below:

Column 1, line 6, change "application serial number 382,930 to -- 283,930 --

Claim 17, line 1, change "claim 1" to -- claim 9 --

Claim 18, line 1, change "claim 1" to -- claim 9 --

Claim 19, line 1, change "claim 1" to -- claim 9 --

Signed and Sealed this

Twelfth Day of August 1986

[SEAL]

Attest:

DONALD J. QUIGG

Attesting Officer

Commissioner of Patents and Trademarks